United States Patent
Lee et al.

(10) Patent No.: US 8,482,017 B2
(45) Date of Patent: Jul. 9, 2013

(54) ORGANIC LIGHT EMITTING DIODE DEVICE

(75) Inventors: Sung-Soo Lee, Yongin (KR);
Gwan-Hyoung Lee, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 55 days.

(21) Appl. No.: 13/188,338

(22) Filed: Jul. 21, 2011

(65) Prior Publication Data

US 2012/0097989 A1 Apr. 26, 2012

(30) Foreign Application Priority Data

Oct. 22, 2010 (KR) ........................ 10-2010-0103506

(51) Int. Cl.
*H01L 51/54* (2006.01)

(52) U.S. Cl.
USPC ...................... 257/96; 313/506; 257/E51.019

(58) Field of Classification Search
USPC ................... 313/506; 257/E51.019, 40, 96
See application file for complete search history.

(56) References Cited

U.S. PATENT DOCUMENTS

| 7,985,974 | B2 * | 7/2011 | Nowatari et al. | 257/87 |
| 8,207,540 | B2 * | 6/2012 | Nowatari et al. | 257/87 |
| 2006/0250079 | A1 * | 11/2006 | Kwok et al. | 313/506 |
| 2006/0261731 | A1 * | 11/2006 | Aziz et al. | 313/504 |
| 2006/0263629 | A1 * | 11/2006 | Aziz et al. | 428/690 |
| 2009/0195146 | A1 | 8/2009 | Hatwar et al. | |

FOREIGN PATENT DOCUMENTS

| KR | 10-2009-0059842 | 6/2009 |
| KR | 10-2009-0129861 | 12/2009 |

* cited by examiner

*Primary Examiner* — George Fourson, III
(74) *Attorney, Agent, or Firm* — Robert E. Bushnell, Esq.

(57) ABSTRACT

An organic light emitting diode device comprises a first electrode, a second electrode facing the first electrode, a first light emitting unit and a second light emitting unit positioned between the first electrode and the second electrode, a charge generation layer positioned between the first light emitting unit and the second light emitting unit, and a charge balance layer positioned adjacent to charge generation layer and including a lithium-containing compound.

10 Claims, 4 Drawing Sheets

ORGANIC LIGHT EMITTING DIODE DEVICE

CLAIM OF PRIORITY

This application makes reference to, incorporates the same herein, and claims all benefits accruing under 35 U.S.C. §119 from an application earlier filed in the Korean Intellectual Property Office on the 22 Oct. 2010 and there duly assigned Serial No. 10-2010-0103506.

BACKGROUND OF THE INVENTION

1. Field of the Invention

The present invention relates to an organic light emitting diode device having improved luminous efficiency and life-span.

2. Description of the Related Art

Recently, an organic light emitting diode (OLED) device has been considered as a display device and an illumination device.

The organic light emitting diode device, in general, includes two electrodes and an emission layer disposed therebetween, and emits light when electrons injected from one electrode are combined with holes injected from the other electrode, thus forming excitons and releasing energy.

Since the organic light emitting diode device emits light in itself without a particular light source, it has low power consumption and excellent response speeds, viewing angles and contrast ratios.

Such an organic light emitting diode device is required to have high luminous efficiency and life-span.

SUMMARY OF THE INVENTION

The present invention provides an organic light emitting diode device having improved luminous efficiency and life-span.

According to one embodiment of the invention, an organic light emitting diode device comprises a first electrode, a second electrode facing the first electrode, a first light emitting unit and a second light emitting unit positioned between the first electrode and the second electrode, a charge generation layer positioned between the first light emitting unit and the second light emitting unit, and a charge balance layer positioned adjacent to the charge generation layer and including lithium quinolate (Liq), lithium fluoride (LiF), or a combination thereof.

The lithium quinolate (Liq), lithium fluoride (LiF), or a combination thereof may be present independently without mixing other organic or inorganic materials.

The charge generation layer may include a first charge generation layer disposed near the first electrode and a second charge generation layer disposed near the second electrode, and at least one charge balance layer may be disposed near the first charge generation layer.

The charge generation layer may include a first charge generation layer disposed near the first electrode and a second charge generation layer disposed near the second electrode, and at least one charge balance layer may be disposed near the second charge generation layer.

The charge generation layer may include a first charge generation layer disposed near the first electrode and a second charge generation layer disposed near the second electrode, and at least one charge balance layer may be disposed between the first charge generation layer and the second charge generation layer.

The charge generation layer may include a first charge generation layer disposed near the first electrode and a second charge generation layer disposed near the second electrode, and at least one charge balance layer may include a first charge balance layer disposed near at least one of the first charge generation layer and the second charge generation layer and a second charge balance layer interposed between the first charge generation layer and the second charge generation layer.

The charge generation layer may not include lithium quinolate (Liq), lithium fluoride (LiF), or a combination thereof.

The first light emitting unit and the second light emitting unit may independently and respectively include an emission layer and at least one auxiliary layer selected from a hole injection layer (HIL), a hole transport layer (HTL), an electron transport layer (ETL) and an electron injection layer (EIL).

At least one of the first light emitting unit and the second light emitting unit may include at least two emission layers.

Colors displayed by the emission layer of the first light emitting unit and colors displayed by the emission layer of the second light emitting unit may be combined to display a white color.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
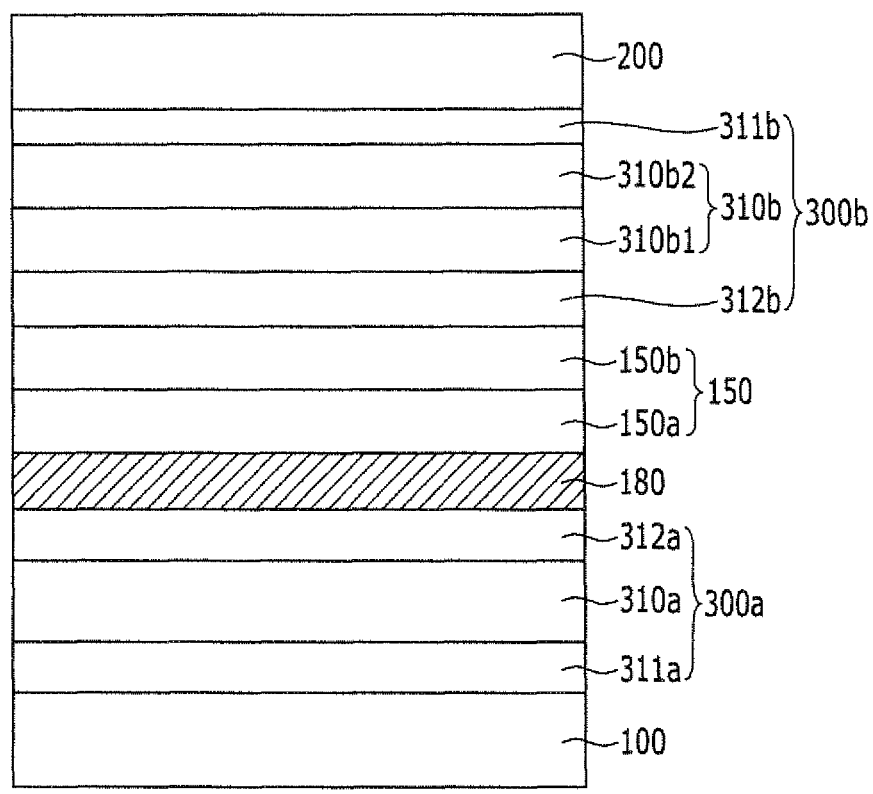
FIG. 1 is a cross-sectional view of an organic light emitting diode device according to a first embodiment of the invention.

The present disclosure will be described more fully hereinafter with reference to the accompanying drawings, in which exemplary embodiments of this disclosure are shown. This disclosure may, however, be embodied in many different forms and should not be construed as being limited to the exemplary embodiments set forth herein.

In the drawings, the thickness of layers, films, panels, regions, etc. are exaggerated for clarity. Like reference numerals designate like elements throughout the specification. It will be understood that, when an element such as a layer, film, region or substrate is referred to as being "on" another element, it can be directly on the other element or intervening elements may also be present. In contrast, when an element is referred to as being "directly on" another element, there are no intervening elements present.

An organic light emitting diode device in accordance with an embodiment of this disclosure will now be described with reference to FIG. 1.

FIG. 1 is a cross-sectional view of an organic light emitting diode device according to a first embodiment of the invention.

Referring to FIG. 1, the organic light emitting diode device according to a first embodiment includes a lower electrode 100 and an upper electrode 200 facing each other, a first light emitting unit 300a disposed on one side of the lower electrode 100, a second light emitting unit 300b disposed on one side of the upper electrode 200, a charge generation layer (CGL) 150 disposed between the first light emitting unit 300a and the second light emitting unit 300b, and a charge balancing layer (CBL) 180 disposed on one side of the charge generation layer 150.

The lower electrode 100 may be made of a transparent conductor or an opaque conductor. The transparent conductor may be, for example, a transparent conductive oxide such as indium tin oxide (ITO) or indium zinc oxide (IZO). The opaque conductor may be, for example, a metal such as aluminum (Al), copper (Cu), molybdenum (Mo), silver (Ag), or a combination thereof.

The upper electrode 200 may also be formed of a transparent conductor or an opaque conductor, and at least one element between the lower electrode 100 and the upper electrode 200 may be formed as a transparent conductor.

One of the lower electrode 100 and the upper electrode 200 is an anode and the other is a cathode.

The first light emitting unit 300a and the second light emitting unit 300b may be light emitting units representing different colors, and a white color may be represented by combining the colors represented by the first light emitting unit 300a and the second light emitting unit 300b.

The first light emitting unit 300a may include an emission layer 310a, and a lower auxiliary layer 311a and an upper auxiliary layer 312a for improving luminous efficiency of the emission layer 310a.

The emission layer 310a of the first light emitting unit 300a may be made of an organic material emitting one light among primary colors, such as red, green, blue and the like, or a mixture of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based a pigment, rubrene, perylene, 9,10-diphenylanthracene, tetraphenylbutadiene, Nile red, coumarin, quinacridone, and the like.

The auxiliary layers 311a and 312a of the first light emitting unit 300a may include an electron transport layer (ETL) and a hole transport layer (HTL) for creating a balance between electrons and holes, an electron injection layer (EIL) and a hole injection layer (HIL) for reinforcing injection of electrons and holes, and the like. The auxiliary layers 311a and 312a may include one or more layers selected from an electron transport layer (ETL), a hole transport layer (HTL), an electron injection layer (EIL), and a hole injection layer (HIL).

For example, when the lower electrode 100 is an anode, the lower auxiliary layer 311a of the first light emitting unit 300a may be a hole transport layer (HTL) and/or a hole injection layer (HIL), and the upper auxiliary layer 312a of the first light emitting unit 300a may be an electron transport layer (ETL) and/or an electron injection layer (EIL).

The second light emitting unit 300b may include an emission layer 310b, and a lower auxiliary layer 311b and an upper auxiliary layer 312b for improving luminous efficiency of the emission layer 310b.

The emission layer 310b of the second light emitting unit 300b may include a double emission layer 310b1 and 310b2 representing two different colors, and the colors represented by the double emission layer 310b1 and 310b2 may be combined with the color represented by the emission layer 310a of the first light emitting unit 300a to represent a white color. For example, the emission layer 310a of the first light emitting unit 300a may be a red emission layer, and the double emission layer 310b1 and 310b2 of the first light emitting unit 300b may include a green emission layer and a blue emission layer, and white may be represented by combining the red emission layer, the green emission layer and the blue emission layer.

The lower auxiliary layer 311b and the upper auxiliary layer 312b of the second light emitting unit 300b may also include one or more layers selected from an electron transport layer (ETL), a hole transport layer (HTL), an electron injection layer (EIL) and a hole injection layer (HIL).

For example, when the upper electrode 200 is a cathode, the lower auxiliary layer 311b of the second light emitting unit 300b may be an electron transport layer (ETL) and/or an electron injection layer (EIL), and the upper auxiliary layer 312b of the second light emitting unit 300b may be a hole transport layer (HTL) and/or a hole injection layer (HIL).

The charge generation layer 150 includes a first charge generation layer 150a which is disposed close to the first electrode 100 and a second charge generation layer 150b which is disposed close to the second electrode 200.

One of the first charge generation layer 150a and the second charge generation layer 150b may be a hole generation layer and the other may be an electron generation layer.

For example, when the first electrode 100 is an anode and the second electrode 200 is a cathode, the first charge generation layer 150a may be an electron generation layer and the second charge generation layer 150b may be a hole generation layer. In this case, the first light emitting unit 300a may form excitons by combining holes transferred from the lower electrode 100, which is the anode, and electrons transferred from the charge generation layer 150a, which is the electron generation layer, in the emission layer 310a. Also, the second light emitting unit 300b may form excitons by combining electrons transferred from the upper electrode 200, which is the cathode, and holes transferred from the charge generation layer 150b, which is the hole generation layer, in the emission layer 310b.

The charge balance layer 180 may control the transfer speed and number of electric charges transferring to the first light emitting unit 300a and the second light emitting unit 300b by being disposed close to the charge generation layer 150. In other words, since the transfer speed of holes is generally faster than the transfer speed of electrons, the charge balance layer 180 may slow down the transfer speed of holes or increase the transfer speed of electrons so as to balance the transfer speeds between holes and electrons and increase the generation efficiency of excitons.

For example, when the lower electrode 100 is an anode, the first charge generation layer 150a serves as the electron generation layer, and the charge balance layer 180 may increase the transfer speed of electrons injected from the first charge generation layer 150a.

Meanwhile, although FIG. 1 shows an example wherein the charge balance layer 180 is disposed close to the first charge generation layer 150a, the spirit and scope of this disclosure is not limited thereto and the charge balance layer 180 may be disposed close to the second charge generation layer 150b.

For example, when the upper electrode 200 is a cathode, the second charge generation layer 150b serves as a hole generation layer. Thus, the charge balance layer 180 may decrease the transfer speed of the holes implanted from the second charge generation layer 150b.

The charge balance layer 180 may be formed of a material which may slow down the transfer of holes and increase the transfer of electrons. Non-limiting examples of such materials include lithium quinolate (Liq), lithium fluoride (LiF), and a combination thereof.

The lithium quinolate (Liq), lithium fluoride (LiF), or a combination thereof may be present independently without mixing other organic or inorganic materials. That is to say, the lithium quinolate (Liq), lithium fluoride (LiF), or a combination thereof may not be included as a host-dopant material, and may independently be made of a film.

The lithium quinolate (Liq) or the lithium fluoride (LiF) is formed adjacent to the charge generation layer 150, and controls the transfer speed of the holes and electrons injected from the charge generation layer 150 so as to maintain the balance of charges for formation of excitons. Accordingly, the life-span of the organic light emitting diode device may be improved.

Meanwhile, the material which forms the charge balance layer 180, such as the lithium quinolate (Liq) or the lithium fluoride (LiF), is not used as a part of the charge generation layer 150. When the lithium quinolate (Liq) or the lithium fluoride (LiF) is used as a part of the charge generation layer 150, the charge generation efficiency is not so great that the driving voltage may be increased and the current characteristic may be deteriorated. In short, the material such as lithium quinolate (Liq) or lithium fluoride (LiF) material is used as the charge balance layer 180 adjacent to the charge generation layer 150, and it is not used as the charge generation layer 150 itself.

Hereinafter, an organic light emitting diode device according to another embodiment of the invention is described with reference to FIG. 2.

Figure 2:
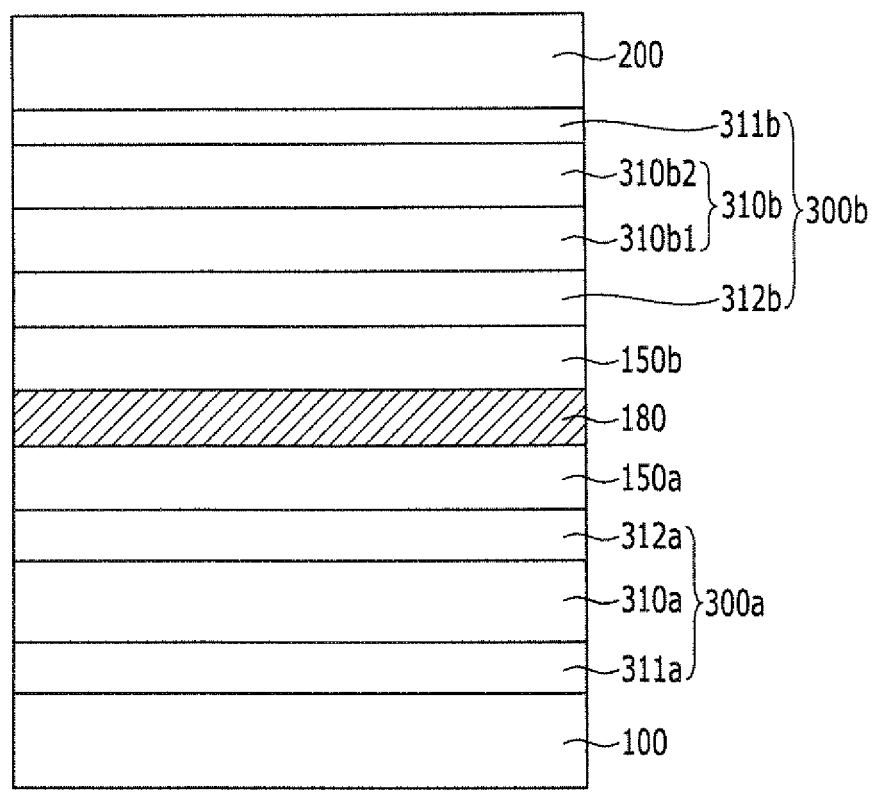
FIG. 2 is a cross-sectional view of an organic light emitting diode device according to a second embodiment of the invention.

FIG. 2 is a cross-sectional view of an organic light emitting diode device according to a second embodiment of the invention.

Referring to FIG. 2, the organic light emitting diode device according to this embodiment also includes a lower electrode 100 and an upper electrode 200 facing each other, a first light emitting unit 300a disposed on one side of the lower electrode 100, a second light emitting unit 300b disposed on one side of the upper electrode 200, charge generation layers 150a and 150b disposed between the first light emitting unit 300a and the second light emitting unit 300b, and a charge balance layer (CBL) 180 disposed adjacent to the charge generation layers 150a and 150b.

However, in contrast to the first embodiment, in the second embodiment, the charge balance layer 180 is disposed between the two charge generation layers 150a and 150b. Since the charge balance layer 180 is disposed between the two charge generation layers 150a and 150b, it is possible to prevent the organic material which forms the charge generation layers 150a and 150b from being damaged, and to prevent the life-span from decreasing due to leakage charges when the charges are generated, in and isolated from, the charge generation layers 150a and 150b, and to alleviate the decrease in the characteristics of the charge generation layers 150a and 150b as time passes.

The following examples illustrate the present invention in more detail. However, these examples are not in any sense to be interpreted as limiting the scope of the invention.

EXAMPLE 1

Indium tin oxide (ITO) was disposed on a glass substrate and patterned. N4,N4'-diphenyl-N4-(9-phenyl-9H-carbazol-2-yl)-N4'-(9-phenyl-9H-carbazol-3-yl)biphenyl-4,4'-diamine was deposited as a hole injection layer (HIL) and N,N'-diphenyl-N,N'-bis(3-methylphenyl)-1,1'-biphenyl-4,4'-diamine (TPD) was deposited as a hole transport layer (HTL). Subsequently, a blue emission layer was deposited thereon.

Lithium quinolate (Liq) was then deposited on the electron transport layer (ETL) so as to be about 5 nm thick as a charge balance layer, and Cs-doped Alq3 and F4TCNQ-doped TPD were sequentially stacked as a charge generation layer.

Subsequently, a hole injection layer (HIL) and a hole transport layer (HTL) of the same material were stacked, and then a red emission layer and a green emission layer were sequentially stacked. Subsequently, aluminum (Al) was stacked as a cathode.

EXAMPLE 2

An organic light emitting diode device was fabricated according to the same method as in Example 1, except that lithium quinolate (Liq) was formed so as to be about 5 nm thick as a charge balance layer between the two charge generation layers.

COMPARATIVE EXAMPLE 1

An organic light emitting diode device was fabricated according to the same method as in Example 1, except that lithium quinolate (Liq) was not formed.

COMPARATIVE EXAMPLE 2

An organic light emitting diode device was fabricated according to the same method as in Example 1, except that lithium quinolate (Liq) was formed instead of the Cs-doped Alq3 layer of the charge generation layer.

Evaluation-1

The light emitting intensities of the organic light emitting diode devices fabricated according to Examples 1 and 2 and Comparative Example 1 were measured according to time.

Figure 3:
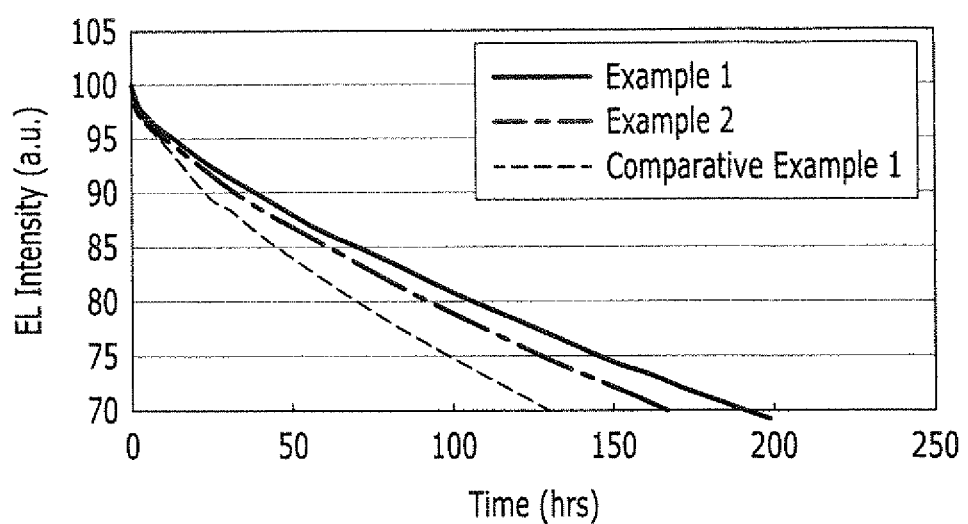
FIG. 3 is a graph showing light emitting intensity vs. time of operation of the organic light emitting diode devices according to Examples 1 and 2 and Comparative Example 1.

FIG. 3 is a graph showing light emitting intensity vs. time of operation of the organic light emitting diode devices according to Examples 1 and 2 and Comparative Example 1.

Referring to FIG. 3, the organic light emitting diode devices according to Examples 1 and 2 maintained more than about 70% of the light emitting intensity for more than about 150 hours, compared to the initial light emitting intensities. On the other hand, the organic light emitting diode device of Comparative Example 1 had the light emitting intensity considerably dropping as time passes, compared to the organic light emitting diode devices of Examples 1 and 2.

It may be seen from the result that the life-span characteristics of the organic light emitting diode devices of Examples 1 and 2 were improved, compared to the organic light emitting diode device of Comparative Example 1.

Evaluation-2

The driving voltage characteristic of the organic light emitting diode device fabricated according to Comparative Example 2, which uses lithium quinolate as a charge generation layer, was examined.

Figure 4:
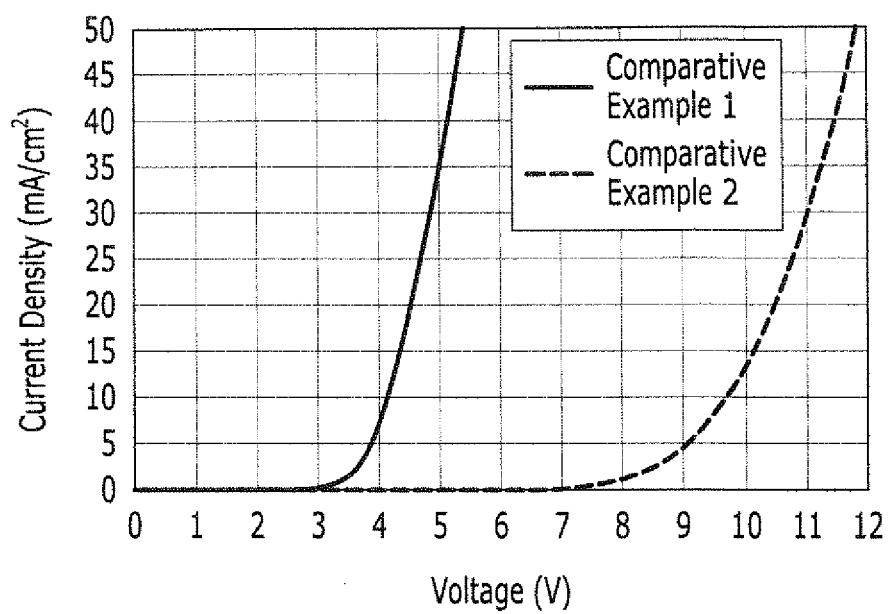
FIG. 4 is a graph showing current density vs. voltage of the organic light emitting diode devices according to Comparative Examples 1 and 2.

FIG. 4 is a graph showing current density vs. voltage of the organic light emitting diode devices according to Comparative Examples 1 and 2.

Referring to FIG. 4, the organic light emitting diode device of Comparative Example 2 has a lower voltage-based current density and a higher driving voltage for reaching the same current density, compared to the organic light emitting diode device of Comparative Example 1.

Therefore, it may be seen that, when lithium quinolate is used not as a charge balance layer but as a charge generation layer, the current characteristic is deteriorated and the driving voltage is increased.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode device, comprising:
   a first electrode;
   a second electrode facing the first electrode;
   a first light emitting unit and a second light emitting unit positioned between the first electrode and the second electrode;
   a charge generation layer positioned between the first light emitting unit and the second light emitting unit and comprising a first charge generation layer disposed near the first electrode and a second charge generation layer disposed near the second electrode; and
   a charge balance layer positioned adjacent to the charge generation layer and including at least one of lithium quinolate (Liq), lithium fluoride (LiF), and a combination thereof.

2. The organic light emitting diode device of claim 1, wherein said at least one of lithium quinolate (Liq), lithium fluoride (LiF), and a combination thereof is present independently without mixing other organic or inorganic materials.

3. The organic light emitting diode device of claim 1, wherein
   the charge balance layer is disposed nearer to the first charge generation layer than to the second charge generation layer.

4. The organic light emitting diode device of claim 1, wherein the charge balance layer is disposed nearer to the second charge generation layer than to the first charge generation layer.

5. The organic light emitting diode device of claim 1, wherein the charge balance layer is positioned between the first charge generation layer and the second charge generation layer.

6. The organic light emitting diode device of claim 1, wherein the charge balance layer includes:
   a first charge balance layer disposed near at least one of the first charge generation layer and the second charge generation layer; and
   a second charge balance layer positioned between the first charge generation layer and the second charge generation layer.

7. The organic light emitting diode device of claim 1, wherein the charge generation layer does not include any one of lithium quinolate (Liq), lithium fluoride (LiF) and a combination thereof.

8. The organic light emitting diode device of claim 1, wherein each the first light emitting unit and the second light emitting unit comprises an emission layer; and
   wherein said device further comprises at least one auxiliary layer selected from a hole injection layer (HIL), a hole transport layer (HTL), an electron transport layer (ETL) and an electron injection layer (EIL).

9. The organic light emitting diode device of claim 8, wherein at least one of the first light emitting unit and the second light emitting unit comprises at least two emission layers.

10. The organic light emitting diode device of claim 8, wherein colors displayed by the emission layer of the first light emitting unit and colors displayed by the emission layer of the second light emitting unit are combined to display a white color.

* * * * *